United States Patent [19]

Kaplinsky

[11] Patent Number: 5,298,816
[45] Date of Patent: Mar. 29, 1994

[54] WRITE CIRCUIT FOR CMOS LATCH AND MEMORY SYSTEMS

[76] Inventor: Cecil H. Kaplinsky, 140 Melville Ave., Palo Alto, Calif. 94301

[21] Appl. No.: 39,966

[22] Filed: Mar. 30, 1993

[51] Int. Cl.[5] ............... H03K 17/687; H03K 3/01
[52] U.S. Cl. .................... 307/571; 307/296.1; 307/296.3; 365/227; 365/229
[58] Field of Search .............. 307/571, 296.1, 296.3; 365/227, 229

[56] References Cited

U.S. PATENT DOCUMENTS

| | | | |
|---|---|---|---|
| 4,876,669 | 10/1989 | Yamamoto et al. | 365/189.01 |
| 4,910,711 | 3/1990 | Guo | 365/189.06 |
| 4,953,127 | 8/1990 | Nagahashi et al. | 365/189.05 |
| 5,010,521 | 4/1991 | Matsui | 365/189.01 |
| 5,046,052 | 9/1991 | Miyaji et al. | 365/227 |
| 5,226,014 | 7/1993 | McManus | 365/227 |

*Primary Examiner*—Margaret R. Wambach
*Attorney, Agent, or Firm*—Schneck & McHugh

[57] ABSTRACT

A write assist circuit for CMOS inverter-type memory cells and latches having means for choking current flow from a voltage level source to power supply terminals of a group of such memory cells or latches during a data loading or write cycle. The write assist circuit has a pair of pass transistors that respectively connect to one or two voltage level sources. In one embodiment, both pass transistors connect in parallel to a single voltage level source, one transistor always active being of low conductance, the other transistor of normal conductance being turned off by a write enable signal. In another embodiment, both pass transistors are of normal conductance but are respectively enabled and disabled by a write enable signal and are connected to different voltage level sources so as to supply a lower power supply voltage to the CMOS inverter-type memory cells or latches during a write cycle.

14 Claims, 3 Drawing Sheets

WRITE CIRCUIT FOR CMOS LATCH AND MEMORY SYSTEMS

DESCRIPTION

1. Technical Field

The present invention relates to CMOS latch and memory systems that include level shift circuitry for assisting in the writing of data to the latches or memory cells in the system.

2. Background Art

Integrated circuit designers prefer to use minimum size transistors, wherever possible, in order to minimize the overall area of a particular circuit, while still meeting certain performance requirements for the circuit. In CMOS latch and memory systems, this goal of obtaining minimum system area is directed principally toward minimizing the size of each of the plural identical latches or memory cells that make up repeated elements of the system. Thus, one would like to use minimum size transistors, consistent with performance requirements, wherever possible in a CMOS latch or memory cell.

A typical CMOS memory cell of the prior art is shown in FIG. 1. A CMOS latch would be nearly identical, except that a latch lacks the read pass transistor N3 found in memory cells. The memory cell has a pair of CMOS inverters 11 and 12 cross-coupled so that the output of each inverter connects to the input of the other. A data bit is stored in the memory cell in the form of the on/off states of the inverter transistors P1, N1, P2 and N2 and the voltage levels on the nodes 14 and 15 between the two cross-coupled inverters 11 and 12. A new data bit, represented by the voltage level of an input signal DATA-IN, may be loaded into the memory cell through a write pass transistor N4 connected to the node 14 and responsive to a write enable signal WRITE. A stored data bit may be read via a read pass transistor N3 connected to the node 15 and responsive to a read word enable signal READ-WORD-LINE. The voltage level of the output signal DATA-OUT from inverter 12 is thus transferred through the read pass transistor N3 onto an output line 17. It should be noted that the data output signal DATA-OUT is the logical complement of the data input signal DATA-IN, and that an additional inversion will be needed somewhere in the memory system to compensate for the data inversion provided by the memory cells.

The sizes of the read transistors P2, N2 and N3 are essentially determined by the desired speed of the memory array and by the number of words in the array (i.e., the load). The bigger the inverter transistors P2 and N2, the faster the read, as they are able to drive a certain load in a certain time. Desired sizes (channel width/channel length, in micrometers) of the output transistors are 5.5/1 for P2, 2.5/1 for N2, and 4/1 for N3. It will be shown that these minimum sizes cannot be met for the n-channel inverter transistor N2 for the prior art memory cell seen in FIG. 1.

The transistors P1 and N1 of the feedback inverter 11, which regenerate the voltage level representing the stored data bit, should be kept as small as possible. They have no dynamic load. Therefore, making them bigger would not enhance the circuit. Further, during the write process, they fight against the loading of new data into the memory cell, making writing slow and difficult. In order to put new data DATA-IN into the memory cell, the current flowing through the write pass transistor N4 must be sufficient to overcome the ability of transistors P1 and N1 to respectively source or sink current in order for a successful voltage transition to take place. Note that for any given fabrication process, the current through a transistor is proportional to its size. Yet, the write pass transistor N4 cannot be made too big without having a memory cell that is also too big. Transistor N4 is preferably no larger than 4/1 and ideally would be as small as 1.5/1. Thus, transistors P1 and N1 should be as small as the fabrication process permits. Preferred sizes are 1.5/1 for both transistors P1 and N1. One possible solution to the problem of the feedback inverters fighting against the loading of new data has been to add an extra pass transistor, driven by a complementary write enable signal $\overline{\text{WRITE}}$ to each memory cell between the output of the feedback inverter 11 and the node 14 connecting the write pass transistor N4 to the input of the inverter 12 in order to isolate the feedback inverter transistors P1 and N1 from the write pass transistor N4 during a write cycle. This solution can produce a more writable memory cell, but each extra transistor adds to the overall area taken up by each memory cell, and thus should be avoided, if possible.

Another problem which can occur when writing a "zero" (WRITE=high, DATA-IN=high) into the memory cell of FIG. 1 is the failure of the inverter transistors P2 and N2 to recognize the voltage at node 14 applied to their gates as a new logic level requiring a transition to a new state. When a logic "high" voltage (5.5 V) is transmitted across the n-channel pass transistor N4, there is a voltage drop through the transistor equal to the threshold voltage $V_T$ of the transistor. The net current flowing through pass transistor N4 to the node 14 (i.e., the current flowing through N4 minus the possible current flowing through feedback inverter transistor N1) must be sufficient to charge up the gates of the transistors P2 and N2 to a high enough voltage level so that the transistors P2 and N2 will make the required high-to-low transition on the inverter 12. The transition voltage of inverter 12 is determined by the relative strengths of transistors P2 and N2, as determined by process parameters and their relative sizes. If the fabrication process drifts within its specified range so that the p-channel transistors, including inverter transistor P2, are strong for a given size relative to the n-channel transistors, including inverter transistor N2, then it becomes difficult to meet all of the required performance conditions, such as inverter transition voltages, while keeping all of the transistors in a memory cell small. If transistor P2 is stronger on a given fabricated chip than transistor N2, a higher voltage will be required at node 14 to achieve the desired transition. Accordingly, a typical design solution is to increase the size of transistor N2, making it larger than transistor P2, to ensure a relatively low transition voltage even when the fabrication process drifts. In such a solution, optimized sizes for a memory cell that will work for power supply voltages between 3 volts and 5.5 volts are 1.5/4 for P1, 1.5/5.5 for N1, 2/1 for N4, 5.5/1 for P2, 22/1 for N2, and 4/1 for N3. The very large size of transistor N2 makes achieving small memory cells nearly impossible with this approach.

In U.S. Pat. No. 4,953,127, Nagahashi et al. describe a semiconductor memory device in which each of a plurality of memory cells has a pair of memory transistors, turned on or off in a complementary manner depending on the data bit stored therein, and a pair of transfer gate transistors coupled between the memory transistors and a pair of complementary bit lines associated with a column of memory cells. The transfer gate transistors are gated by a word line associated with a row of memory cells. Both transfer gate transistors are used for both reading and writing operations. A word line driving circuit supplies a selected word line with a relatively higher voltage level $V_{CC}$ in the write mode compared to the voltage $V_{CC}/2$ supplied in the read mode. Driving the transfer gate transistors with the lower voltage $V_{CC}/2$ during a read operation keeps data bits stored in the accessed memory cells from being erased, even when memory transistors with the same gate widths as the transfer gate transistors are used, while using the full voltage level $V_{CC}$ during write operations allows the write-in of new data from the pair of complementary bit lines to be rapidly completed.

It is an object of the invention to provide a semiconductor memory (or a set of latches) in which neither an extra transistor per memory cell (or latch) nor any increase of transistor sizes is necessary in order to achieve fast, easy writing of data into the memory (or latches), so that minimum size memory cells (or latches) can be used.

DISCLOSURE OF THE INVENTION

The above object has been met with a write circuit for assisting in the loading of data into data storage elements in an integrated circuit device, and especially in an information storage and retrieval device or "memory chip," in which one of a pair of pass transistors connected between a voltage level source and the power supply terminal for a group of data storage elements restricts or chokes the current flow to the data storage elements during a write cycle so that there is no opposition to the loading of data into that group of data storage elements during that write cycle. In one embodiment, one low saturation current pass transistor is always active ("on") while the other pass transistor with higher saturation current is responsive to a write enable signal to be inactive ("off") during the write cycle, thereby choking the current, but active at all other times so as to permit normal current flow to the data storage elements. In another embodiment, the two pass transistors are connected to different voltage level sources with one source of substantially lower voltage than the other. Both transistors are responsive to a write enable signal, but in complementary manner, to supply the lower voltage to the data storage elements during a write cycle and the higher voltage at all other times. The choking of the power supply reduces the opposition to new data of the regenerative inverter in each storage element, enabling smaller inverter transistors to be used.

BEST MODE FOR CARRYING OUT THE INVENTION

Figure 1:
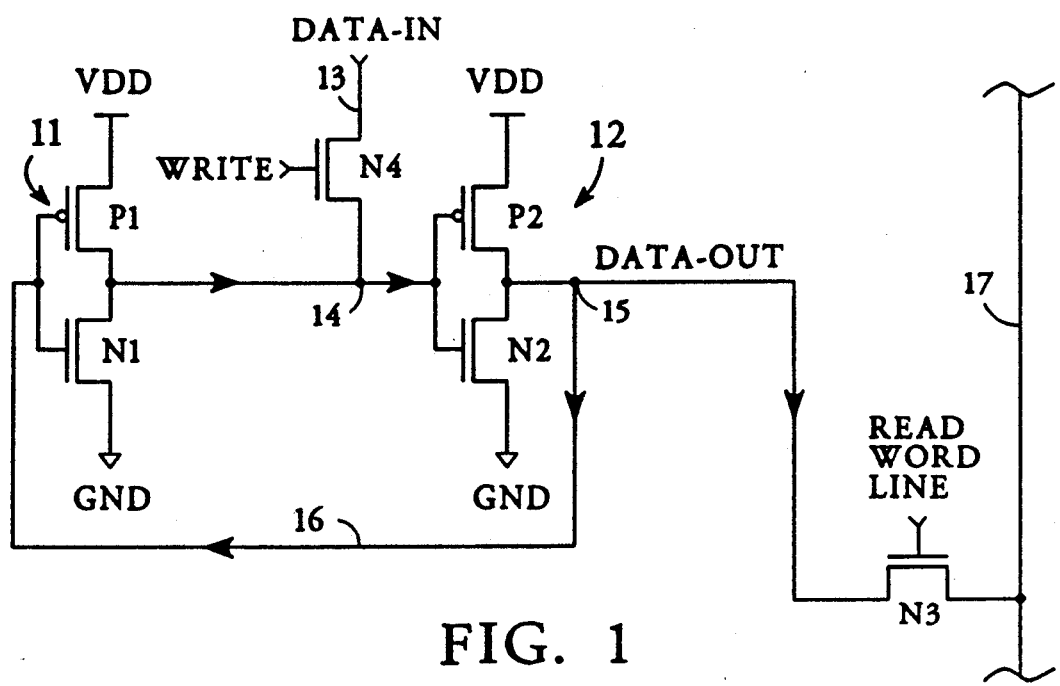
FIG. 1 is a schematic circuit diagram of a memory cell of the prior art.
Figure 2:
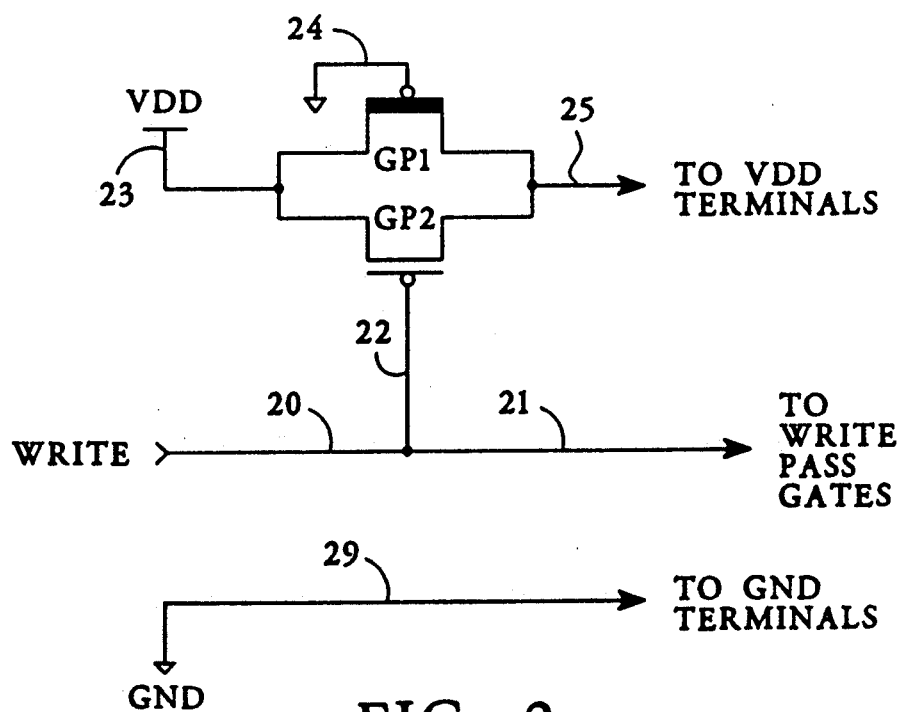
FIG. 2 is a schematic circuit diagram of a write circuit of the present invention for assisting the loading of data into a group of plural data storage elements in an integrated circuit device.

With reference to FIG. 1, the memory cell of the prior art may be used with the write circuit of the present invention, if modified so that the power supply and ground terminals connected to the memory cell inverters 11 and 12, labeled VDD and GND, are not directly connected to $V_{DD}$ and ground voltage level sources, but are instead coupled to the sources through the write circuit of FIG. 2. The write circuit of the present invention is applicable both to memory systems having a plurality of memory cells and also applies to sets of latches. As previously mentioned, the latches are like the memory cell in FIG. 1, but with the read pass transistor N3 removed. Five-transistor SRAM memory cells which combine the read and write pass transistors N3 and N4 into a single pass transistor could also be used with the write circuit of the present invention. Both memory chips and integrated circuits of some other purpose, such as logic chips, with a large number of data storage elements resident on the chip are contemplated uses for the write circuit of the present invention.

Figure 3:
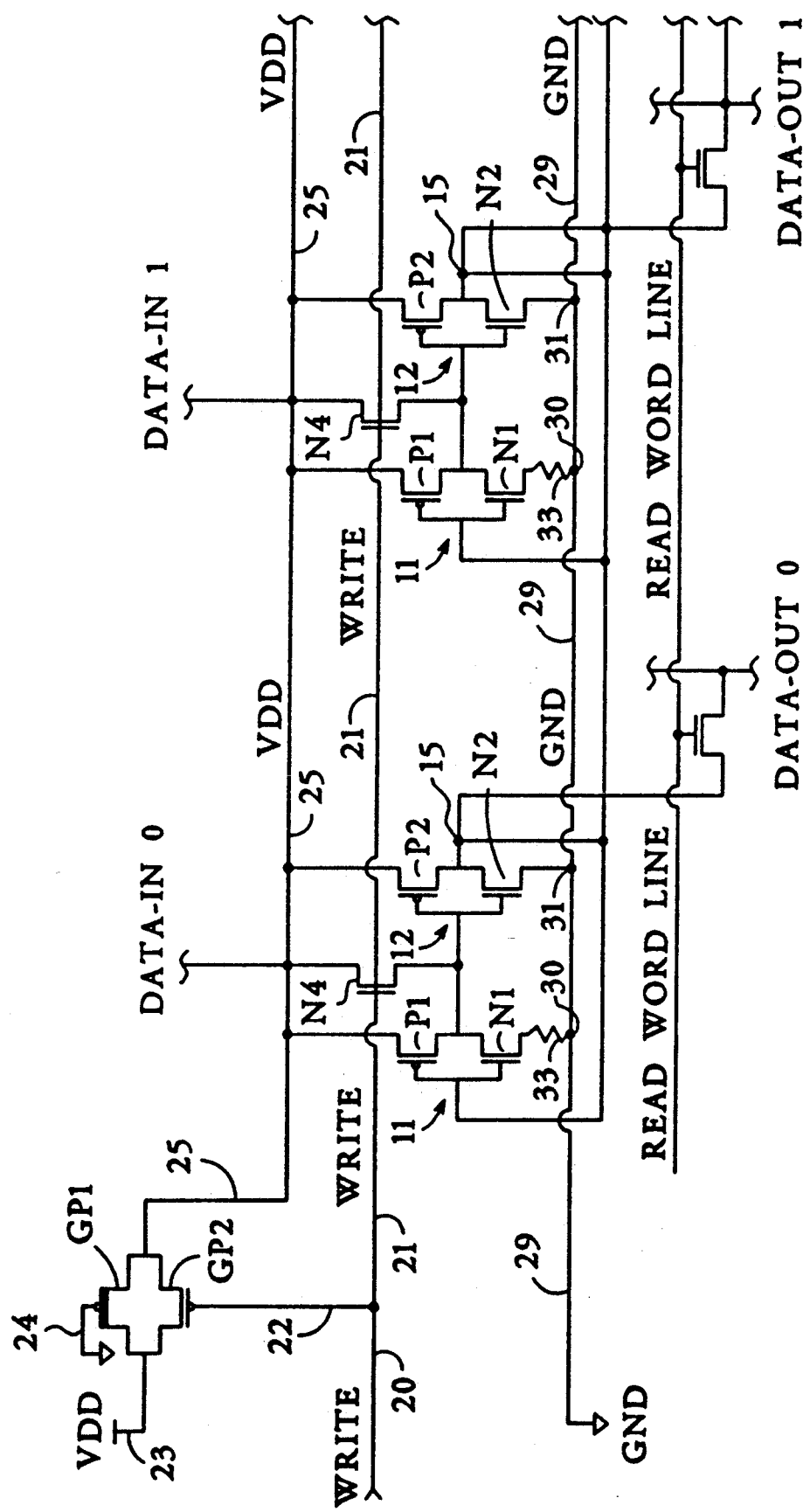
FIG. 3 is a schematic circuit diagram of a portion of an information storage and retrieval (memory or latch) system with the write circuit of FIG. 2.

With reference to FIGS. 2 and 3, a write circuit for assisting in the loading of data into data storage elements of the type having a pair of cross-coupled CMOS inverters includes a write enable signal line 20 for receiving a write enable signal WRITE. The write enable signal WRITE may be generated off-chip and supplied to the chip by way of an external conductive contact or pin or may instead be generated on-chip, for example by a logic circuit that makes use of a separate memory area on the chip. The write enable signal line 20 branches into a main signal line 21 that leads to the gates of n-channel pass transistors N4 of each data storage element in a group of such elements and a choke signal line 22 that leads to a p-channel transistor GP2 of the write circuit. The write circuit in FIG. 2 is shared by a group of memory cells or latches, typically 4, 8 or 16 in number, instead of having one write circuit per cell. FIG. 3 shows two of the memory cells in a larger group of such cells that are connected to the write circuit.

A low conductance, low saturation current, p-channel transistor GP1 is connected to a voltage level source 23 providing a positive power supply voltage VDD. Transistor GP1 is also connected via a line 25 to power supply terminals 26 of each data storage element (memory or latch) in the group of such elements. The transistor GP1 is gated via line 24 to ground so that it is always active, i.e., always conductive or "on." A typical transistor GP1 has an effective size (channel width/channel length) of about 1.0/12.0 micrometers and can be formed as three distinct p-channel transistors in series, each with a size of about 1.0/4.0 micrometers and each being gated to ground. Typically, the low conductance, low saturation current transistor GP1, when active, allows only about 17.5 microamperes of current to flow from the voltage level source 23 to the power supply terminals 26 of the data storage elements.

In the same way as the first transistor GP1, a second, normal or high conductance, normal or high saturation current, p-channel transistor GP2 is connected to the voltage level source 23 providing the positive power supply voltage VDD and via line 25 to the power supply terminals 26 of each of the data storage elements in the group of such elements. A typical size for transistor GP2 is about 44.0/1.0 micrometers. This second p-channel transistor GP2 is responsive to the write enable signal WRITE, being connected at its gate to the choke signal line 22 to receive the signal WRITE therefrom. When the write enable signal WRITE is inactive (low), the p-channel transistor GP2 is active (on), allowing normal current flow of a few milliamperes from the voltage level source 23 to the power supply terminals 26 of the data storage elements. When the write enable signal WRITE is active (high), the p-channel transistor GP2 is inactive (off) or nonconductive of current.

Thus, during a write cycle, when the write enable signal WRITE is active, the transistor GP2 shuts off, restricting the amount of current that can flow from the voltage level source 23 to the power supply terminals 26 to the approximately 17.5 microamperes that flow through the first, low conductance, transistor GP1. The write circuit chokes off the power supply, so that current flow available to the inverter transistors P1, N1, P2 and N2 of the data storage elements is reduced to a trickle. This means that current through the p-channel inverter transistor P2 of each data storage element is limited, effectively lowering the transition voltage of the inverter 12. Then, even if the threshold voltage drop through the pass transistor N4 is big, the second inverters 12 will make the transition from high to low when a zero (DATA-IN 0 or DATA-IN 1=high) is written to one or more data storage elements.

The ground supply GND is directly connected via line 29 to the ground terminals 30 and 31 of each data storage element, and thus remains unchoked during a write cycle. Accordingly, the transistor N2 of the second inverter 12 has enough current to establish a low voltage level on the output node 15 of second inverter 12, without having to fight current flowing through the transistor P2 from the power supply terminal 26 during a transition. Choking the power supply thus allows a smaller n-channel transistor N2 to quickly drive the inverter transition with only a small amount of current, reducing memory area. Note that the n-channel transistor N1 of the first inverter 11, which might fight the charging up of the second inverter transistor gates by the pass transistor N4, can be choked of its ground supply by a resistor 33 connected between the transistor N1 and the ground terminal 30 of each data storage element, while having the transistor N2 of the second inverter 12 unchoked by way of a direct connection to ground terminal 31. The resistor, which need not be very large, reduces the effective conductance of transistor N1. However, such choking of the ground supply to first inverter 11 is entirely optional.

With the write circuit of the present invention, typical sizes (channel width/channel length in micrometers) of the storage element transistors are 1.5/1.0 for P1, 1.6/2.0 for N1, 5.5/1.0 for P2, 2.5/1.0 for N2, 4.0/1.0 for N3 and 4.0/1.0 for N4, assuming a power supply voltage VDD of 5.25 volts, a desired transition voltage of 3.0 volts and a 1 $\mu$m CMOS fabrication process in which the smallest available transistor size is 1.5/1.0. These transistor sizes, together with the sharing of the write circuit among a group of data storage elements, saves approximately 20–25% of the memory area used by the device.

Figure 4:
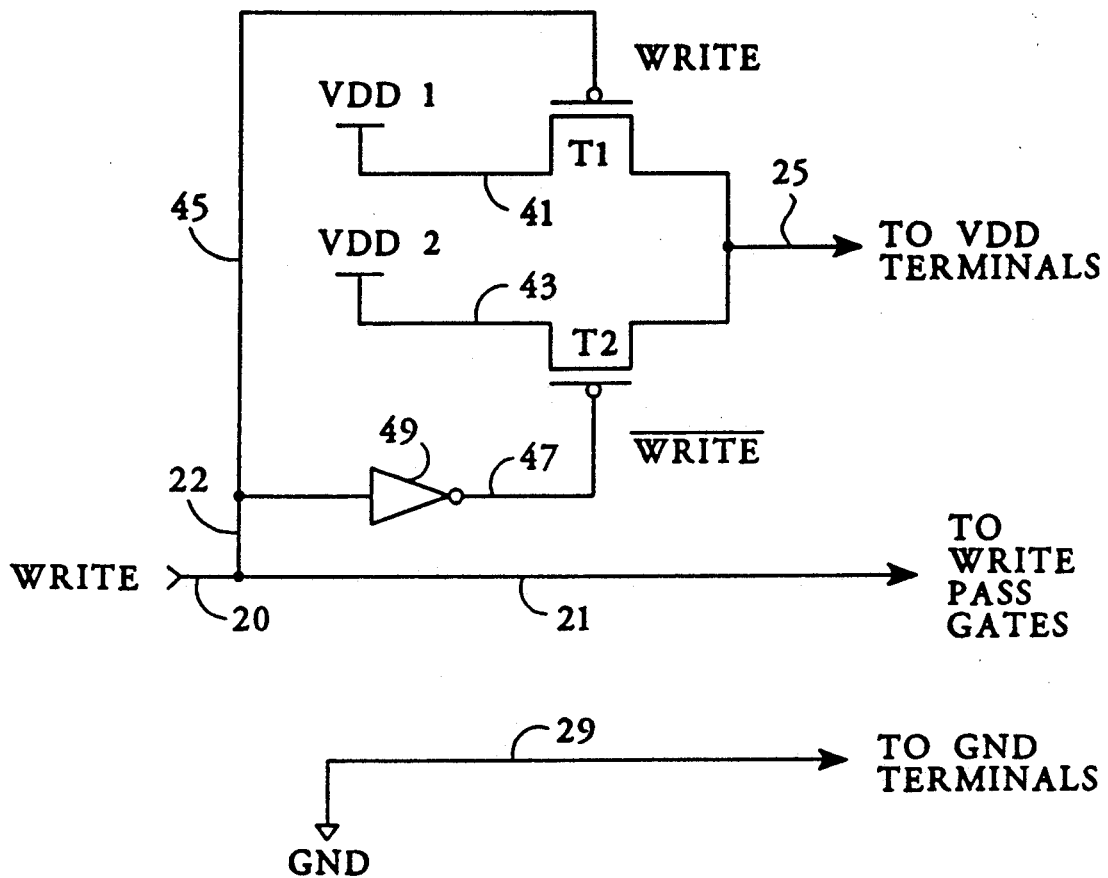
FIG. 4 is a schematic circuit diagram of an alternative write circuit of the present invention.

With reference to FIG. 4, an alternative write circuit of the present invention for choking the power supply terminals of the data storage elements again has a write enable signal line 20 for receiving a write enable signal WRITE, which branches into a main signal line 21 leading to the write pass gates N4 of each data storage element on a group of such storage elements and a choke signal line 22. A first p-channel pass transistor T1 connects between a first voltage level source 41 with a first positive voltage VDD1 and the power supply terminals of each data storage element in the group via line 25. A second p-channel pass transistor T2 connects between a second voltage level source 43 with a second positive voltage VDD2 and the power supply terminals of each data storage element in the group via the same line 25. The second positive voltage VDD2 is significantly lower than the first positive voltage VDD1. Typically, second voltage VDD2 is about 4.2 V, i.e. about 80% of the first voltage VDD1 of about 5.25 V. The first pass transistor T1 is gated by a line 45 directly connected to the choke signal line 22 to receive the write enable signal WRITE therefrom. The second pass transistor T2 is gated by a line 47 indirectly connected to the choke signal line 22 via a CMOS inverter 49. The gate of transistor T2 thus receives and is responsive to the complement $\overline{\text{WRITE}}$ of the write enable signal. The ground supply GND is directly connected to ground terminals of the data storage elements via line 29.

During a write cycle, when the write enable signal WRITE is high, first pass transistor T1 is off, while second pass transistor T2 is on. The power supply terminals of the data storage elements in the group receive the lower voltage level VDD2 from voltage source 43. This effectively chokes the supply like the reduction in current flow of the write circuit in FIG. 2, thereby enabling data loading with minimum size data storage element transistors. During non-write periods, the first transistor T1 is active, while second transistor T2 is inactive, allowing the full supply voltage VDD1 to be provided to the power supply terminals of the data storage elements for fast read operations.

I claim:

1. In an integrated circuit device with plural data storage elements of the type having a first and a second CMOS inverter cross-coupled so that an output of each inverter connects to an input of the other inverter and at least one pass transistor connected between the input of one of said CMOS inverters and a data path, wherein each of said CMOS inverters is coupled to a power supply terminal and to a ground terminal, a write circuit for assisting in the loading of data into said data storage elements comprising means for restricting current flow from said power supply terminal to said CMOS inverters during a write cycle, while maintaining normal current flow from said CMOS inverters to said ground terminal, and means for restoring normal current flow from said power supply terminal to said CMOS inverters at an end of said write cycle, said normal current flow being substantially larger than said restricted current flow.

2. The write circuit of claim 1 wherein said means for restricting current flow and said means for restoring current flow are provided for each of a plurality of groups of plural data storage elements in said integrated circuit device.

3. The write circuit of claim 1 wherein said means for restricting current flow comprises first and second field effect transistors connected together in parallel between a voltage level source and said power supply terminal of each of a plurality of data storage elements, said first field effect transistor having a low saturation current and being gated so as to be always active, said second field effect transistor having a relatively higher saturation current than said first field effect transistor and being responsive to a write enable signal so as to be inactive during said write cycle and active at times other than during said write cycle.

4. The write circuit of claim 1 wherein said means for restricting current flow comprises a first field effect transistor connected between a first voltage level source and said power supply terminal of each of a plurality of data storage elements, said first field effect transistor being responsive to a write enable signal so as to be inactive during said write cycle and active at times other than during said write cycle, and a second field effect transistor connected between a second voltage level source of relatively lower voltage than said first voltage level source and said power supply terminal of each of a plurality of data storage elements, said first field effect transistor being responsive to said write enable signal so as to be active during said write cycle and inactive at times other than during said write cycle.

5. The write circuit of claim 4 wherein said second voltage level source has a voltage that is about 0.8 times the voltage of said first voltage level source.

6. The write circuit of claim 1 wherein said output of said first inverter connects to said at least one pass transistor has a resistor connected between said first inverter and said ground terminal, said second inverter being directly connected to said ground terminal.

7. The write circuit of claim 1 wherein each data storage element has two pass transistors including a write pass transistor responsive to a write enable signal connected between a data input path and the input of said first inverter and also including a read pass transistor responsive to a read enable signal connected between the output of said first inverter and a data output path separate from said data input path.

8. In an information storage and retrieval integrated circuit device having a plurality of data storage elements, wherein each data storage element includes first and second CMOS inverters, each inverter having an input and an output and being coupled to a power supply terminal and to a ground terminal, said inverters being cross-coupled to one another such that the output of said first inverter is connected to the input of said second inverter and the output of said second inverter is connected to the input of said first inverter, each data storage element also including at least a first pass transistor responsive to a write enable signal and connected between a data path and a node between the output of said first inverter and the input of said second inverter, a write circuit for assisting the loading of data into said data storage elements, the write circuit comprising a first field effect transistor connected between a first voltage level source and the power supply terminal of each of a group of plural data storage elements, and a second field effect transistor connected between a second voltage level source and the same power supply terminal as the first field effect transistor, at least one of said first and second field effect transistors being responsive to the write enable signal provided to said data storage elements in said group such that current flow through said field effect transistors to said power supply terminal is reduced whenever said write enable signal is active.

9. The write circuit of claim 8 wherein said first voltage level source is the same as said second voltage level source, said first field effect transistor having a low saturation current and gated to be always active, said second field effect transistor having a relatively higher saturation current than said first field effect transistor and responsive to said write enable signal so as to be inactive whenever said write enable signal is active and to be active whenever said write enable signal is inactive.

10. The write circuit of claim 8 wherein said second voltage level source has a voltage that is substantially less than that of said first voltage level source, said first and second field effect transistors being both responsive to said write enable signal to be respectively inactive and active whenever said write enable signal is active and respectively active and inactive whenever said write enable signal is inactive.

11. The write circuit of claim 10 wherein said voltage of said second voltage level source is about 0.8 times the voltage of said first voltage level source.

12. The write circuit of claim 8 wherein said first inverter is indirectly coupled to said ground terminal via a resistor connected between said first inverter and said ground terminal, and said second inverter is directly connected to said ground terminal.

13. The write circuit of claim 8 wherein each data storage element further includes a second pass transistor responsive to a read enable signal and connected between a second node, located between the output of said second inverter and the input of said inverter, and a data output path.

14. The write circuit of claim 8 wherein each of said first and second CMOS inverters of each data storage element comprised includes a p-channel MOS field effect transistor and an n-channel MOS field effect transistor connected in series between said power supply terminal and said ground terminal with gates of both of said p-channel and n-channel MOS field effect transistors connected together to form the input of said inverter and the connection between said p-channel and n-channel MOS field effect transistors forming the output of said inverter, and wherein channel width and channel length size dimensions of said MOS field effect transistors and of said first pass transistor are respectively about 1.5 $\mu$m and 1.0 $\mu$m for said p-channel MOS field effect transistor of said first inverter, 1.6 $\mu$m and 2.0 $\mu$m for said n-channel MOS field effect transistor of said first inverter, 5.5 $\mu$m and 1.0 $\mu$m for said p-channel MOS field effect transistor of said second inverter, 2.5 $\mu$m and 1.0 $\mu$m for said n-channel MOS field effect transistor of said second inverter, and 4.0 $\mu$m and 1.0 $\mu$m for said first pass transistor.

* * * * *

UNITED STATES PATENT AND TRADEMARK OFFICE
CERTIFICATE OF CORRECTION

PATENT NO. : 5,298,816
DATED : March 29, 1994
INVENTOR(S) : Cecil H. Kaplinsky

It is certified that error appears in the above-indentified patent and that said Letters Patent is hereby corrected as shown below:

Claim 6, column 7, line 26, before "has a resistor" insert - - and - -.

Signed and Sealed this

Twenty-sixth Day of July, 1994

Attest:

BRUCE LEHMAN

*Attesting Officer*      *Commissioner of Patents and Trademarks*